(12) United States Patent
King et al.

(10) Patent No.: US 7,197,353 B2
(45) Date of Patent: Mar. 27, 2007

(54) SENSITIVITY ENCODING MRI ACQUISITION METHOD

(75) Inventors: Kevin F. King, New Berlin, WI (US); Lisa C. Angelos, Hartland, WI (US)

(73) Assignee: General Electric Company, Schnectady, NY (US)

( * ) Notice: Subject to any disclaimer, the term of this patent is extended or adjusted under 35 U.S.C. 154(b) by 913 days.

(21) Appl. No.: 09/952,446

(22) Filed: Sep. 14, 2001

(65) Prior Publication Data

US 2003/0055330 A1 Mar. 20, 2003

(51) Int. Cl.
*A61B 5/05* (2006.01)
(52) U.S. Cl. ............ 600/410; 600/407; 600/421; 600/422; 324/306; 324/307; 324/309; 324/314; 324/318; 324/322
(58) Field of Classification Search ............ 324/307, 324/309, 318, 322, 306, 314, 312, 300; 600/407, 600/410, 421, 422
See application file for complete search history.

(56) References Cited

U.S. PATENT DOCUMENTS

| | | | |
|---|---|---|---|
| 6,377,045 B1 * | 4/2002 | Van Den Brink et al. .. | 324/307 |
| 6,380,741 B1 * | 4/2002 | Hajnal et al. ............ | 324/318 |
| 6,448,771 B1 * | 9/2002 | Harvey et al. ............ | 324/307 |
| 6,492,810 B1 * | 12/2002 | Hajnal ................ | 324/309 |
| 6,556,009 B2 * | 4/2003 | Kellman et al. .......... | 324/309 |
| 6,559,642 B2 * | 5/2003 | King ................... | 324/307 |
| 6,950,543 B2 * | 9/2005 | King et al. ............. | 382/128 |
| 2003/0038798 A1 * | 2/2003 | Besl et al. .............. | 345/420 |
| 2003/0052676 A1 * | 3/2003 | Takahashi et al. ........ | 324/307 |

FOREIGN PATENT DOCUMENTS

WO WO 99/54746 10/1999

OTHER PUBLICATIONS

Magnetic Resonance In Medicine, vol. 42, No. 5, pp. 952-962 Nov. 1999, Pruessman, et al.
Physics In Medicine and Biology, Spin Warp NMR Imaging and Applications to Human Whole-Body Imaging, vol. 25, 1980, pp. 751-756, Edelstein, et al.
A SMASH/SENSE Related Method Using Ratios Of Array Coil Profiles, Proc. 7th JSMRM, Philadelphia, 1999, p. 1648, Wang, et al.
Markus Weiger, et al; 2D SENSE for Faster 3D Imaging; Proc. Intl. Soc. Mag. Reson. Med. 8 (2000); p. 152.
K.F.King, SENSE From a Commercial Perspective; Proc. Second Jint EMBS/EMES Conference, Houston TX, Oct. 23-26, 2002; p. 1175-1176.

* cited by examiner

*Primary Examiner*—Brian L. Casler
*Assistant Examiner*—Baisakhi Roy
(74) *Attorney, Agent, or Firm*—Quarles & Brady LLP

(57) ABSTRACT

A sensitivity encoding method (SENSE) is used to acquire an MR image having a reduced field of view. The number of aliased replicates caused by surrounding object boundaries is calculated for each image pixel location to obtain optimal aliasing artifact suppression without reducing image SNR.

6 Claims, 5 Drawing Sheets

SENSITIVITY ENCODING MRI ACQUISITION METHOD

BACKGROUND OF THE INVENTION

The field of the invention is nuclear magnetic resonance imaging methods and systems. More particularly, the invention relates to methods for acquiring magnetic resonance imaging ("MRI") data using a sensitivity encoding ("SENSE") technique.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The present invention will be described with reference to a variant of the well known Fourier transform (FT) imaging technique, which is frequently referred to as "spin-warp". The spin-warp technique is discussed in an article entitled "Spin-Warp NMR Imaging and Applications to Human Whole-Body Imaging" by W. A. Edelstein et al., *Physics in Medicine and Biology*, Vol. 25, pp. 751–756 (1980). It employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT image acquisition, a series of pulse sequences is performed in which the magnitude of the phase encoding gradient pulse $G_y$ in the pulse sequence is incremented ($\Delta G_y$). The resulting series of views that is acquired during the scan form an NMR image data set from which an image can be reconstructed. The acquisition of each phase encoded view requires a finite amount of time, and the more views that are required to obtain an image of the prescribed field of view and spatial resolution, the longer the total scan time.

Reducing scan time is a very important objective in MRI. In addition to improved patient comfort, shorter scan times free up the imaging system for more patients and reduces image artifacts caused by patient motion. SENSE (SENSitivity Encoding) is a technique described by K. P. Pruessmann, et al., "SENSE: Sensitivity Encoding for Fast MRI", *J. Magn. Reson.* 42, 952–962 (1999), which reduces MRI data acquisition time by using multiple local coils. The idea is to reduce acquisition time by increasing the step size ($\Delta G_y$) between phase encoding views, or equivalently, by reducing the field of view. In either case, the total number of views is reduced with a consequent reduction in scan time. If the object extends outside the reduced field of view, however, aliasing or wrap-around occurs in the phase encoding direction. The SENSE technique removes this aliasing by using knowledge of the surface coil receive field (also called sensitivities) to find the unaliased spin distribution.

For simplicity, one can consider the image intensity variation only in the phase encoding direction, which may be, for example, the y direction. N local coils with B1 receive field sensitivities $S_j(y)$ where $j=0, 1, \ldots N-1$ are used to acquire the NMR data. The reconstructed image intensity for each local coil is weighted by its receive field. If the reconstructed image for coil j is $I_j(y)$, and the ideal proton density distribution, including T1 and T2 weighting factors, is M(y), then $$I_j(y)=S_j(y)M(y). \quad (1)$$

Aliasing or replication occurs in an MR image in the phase encode direction. The replication distance is the same as the field of view. If the field of view FOV is chosen such that the subject is completely contained within this field of view, the replicates of the subject do not overlap and no artifact results in the reconstructed image. If the field of view is reduced in the y direction by a factor of R, the scan time is also correspondingly reduced by a factor of R. However, now the reconstructed image is aliased or replicated in the y direction at multiples of FOV/R=D and aliasing replicates now overlap with resulting loss of diagnostic utility. Mathematically, the image intensity is now $$I_j(y)=S_j(y)M(y)+S_j(y+\Delta y)M(y+\Delta y)+ \ldots +S_j(y+(A-1)\Delta y)M(y+(A-1)\Delta y),$$

for $0 \leq y \Delta y$. Or, the image intensity may be expressed as:

$$I_j(y) = \sum_{k=0}^{A-1} S_j(y+kD)M(y+kD) \quad (2)$$

where j refers to coil number, $s_j(y)$ is the sensitivity of coil j, m(y) is the spin density (including relaxation effects), D is the reduced phase encoding FOV (i.e., D is the original FOV divided by R) and A is the number of aliased replicates at the pixel. If the local coil sensitivities $S_j(y)$ are known, and if $N \geq R$, the proton distribution M(y) can be obtained by solving the resulting N equations. In matrix form equation (2) can be written $$I=SM, \quad (3)$$

where:

$$I = \begin{bmatrix} I_0(y) \\ I_1(y) \\ \vdots \\ I_{N-1}(y) \end{bmatrix}, \quad (4)$$

$$M = \begin{bmatrix} M(y) \\ M(y+D) \\ \vdots \\ M(y+(A-1)D) \end{bmatrix}, \quad (5)$$

and

-continued $$S = \begin{bmatrix} S_0(y) & S_0(y+D) \ldots S_0(y+(A-1)D) \\ S_1(y) & S_1(y+D) \ldots S_1(y+(A-1)D) \\ \vdots \\ S_{N-1}(y) & S_{N-1}(y+D) \ldots S_{N-1}(y+(A-1)D) \end{bmatrix} \quad (6)$$

Note that I and M are N×1 and A×1 dimensional matrices, respectively, while S has dimensions N×A. The solution of equation (3) is efficiently determined using the pseudoinverse of S. Denoting the complex conjugate transpose of S as S* then $$\hat{M} = [(S*S)^{-1}S*]I \quad (7)$$

Typically, the coil sensitivity values $S_j(y)$ are obtained by performing two calibration scans. The calibration scans are performed with the subject of the scan in place and throughout the full prescribed field of view. Calibration data from one scan is acquired with the body RF coil which has a substantially homogeneous receive field, and data from the second calibration scan is acquired using each of the N local coils. The B1 field sensitivity of each local coil is obtained by taking the ratio of the complex calibration images acquired with the body coil and each of the surface coils. For example, if $I_j^{cal}(y)$ and $I_{body}^{cal}(y)$ are the respective full field of view calibration images obtained with surface coil j and the calibration image acquired with the body coil, the sensitivity of the surface coil j is estimated as $$S_j(y) = \frac{I_j^{cal}(y)}{I_{body}^{cal}(y)}. \quad (8)$$

Note that the complex magnetization term M(y) drops out of the ratio in equation (8) if the body coil and the surface coil scans are performed using the same scan prescription. In this case, the reconstructed images have the proton distribution weighted by the body coil B1 field which is normally very homogeneous over the field of view. The sensitivity calibration data may also be obtained using combined signals from the N surface coils as described in co-pending U.S. patent application Ser. No. 09/851,775 filed on May 9, 2001 and entitled "Calibration Method For Use With Sensitivity Encoding MRI Acquisition".

With the SENSE technique it is important to determine the number of overlapped aliased replicates A at each pixel. In general, A is not equal to R if the object is not exactly the same size in the phase encoding direction as the fall SENSE unreduced field of view (DR). If A is overestimated, the image noise will be greater than if A is exact because the geometry factor g will be greater. If A is underestimate, aliasing will not be fully corrected at the pixel.

SUMMARY OF THE INVENTION

The present invention is a method for correctly determining the number of overlapping, aliasing replicates (A) at each pixel in an image such that optimal image quality can be achieved using the SENSE technique. More particularly, an object image is produced from a calibration acquisition which locates the boundaries of an object being imaged; the boundaries of the object are determined in each image plane being acquired with the sense technique; and the number of aliased replicates (A) is calculated at each pixel therein using the object boundaries and the known alias distance of each boundary. The calculated aliased replicates (A) at each image pixel is used to more accurately calculate the spin density signal m(y) at the pixel using the SENSE technique.

DESCRIPTION OF THE PREFERRED EMBODIMENT

Figure 1:
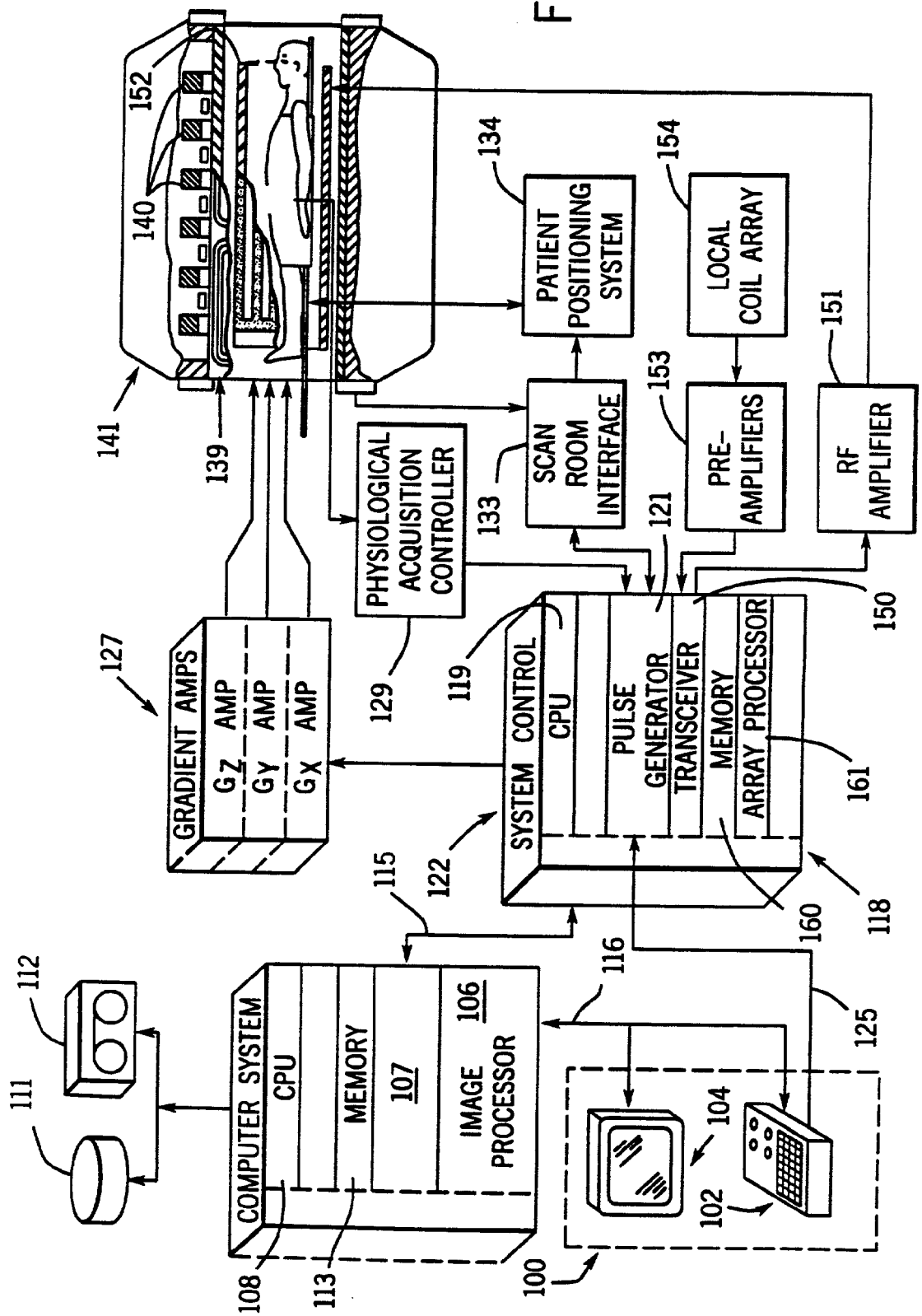
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$, and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152.

A transceiver module 150 in the system control 122 produces pulses which are amplified by an RF amplifier 151 and coupled to the RF coil 152. The resulting signals radiated by the excited spins in the patient may be sensed by the same RF coil 152, but in the preferred embodiment a local coil array indicated at 154 is employed. The local coil array 154 is positioned around the patient anatomy to be imaged and it includes four separate coil elements (shown in FIG. 2) which receive the NMR signals that are produced during the scan. These NMR signals are separately amplified by pre-amplifiers 153 and applied to the inputs of four separate receivers in the transceiver module 150. The amplified NMR signals are demodulated, filtered, and digitized in the receiver sections of the transceiver 150 to produce four separate k-space data sets.

Figure 2:
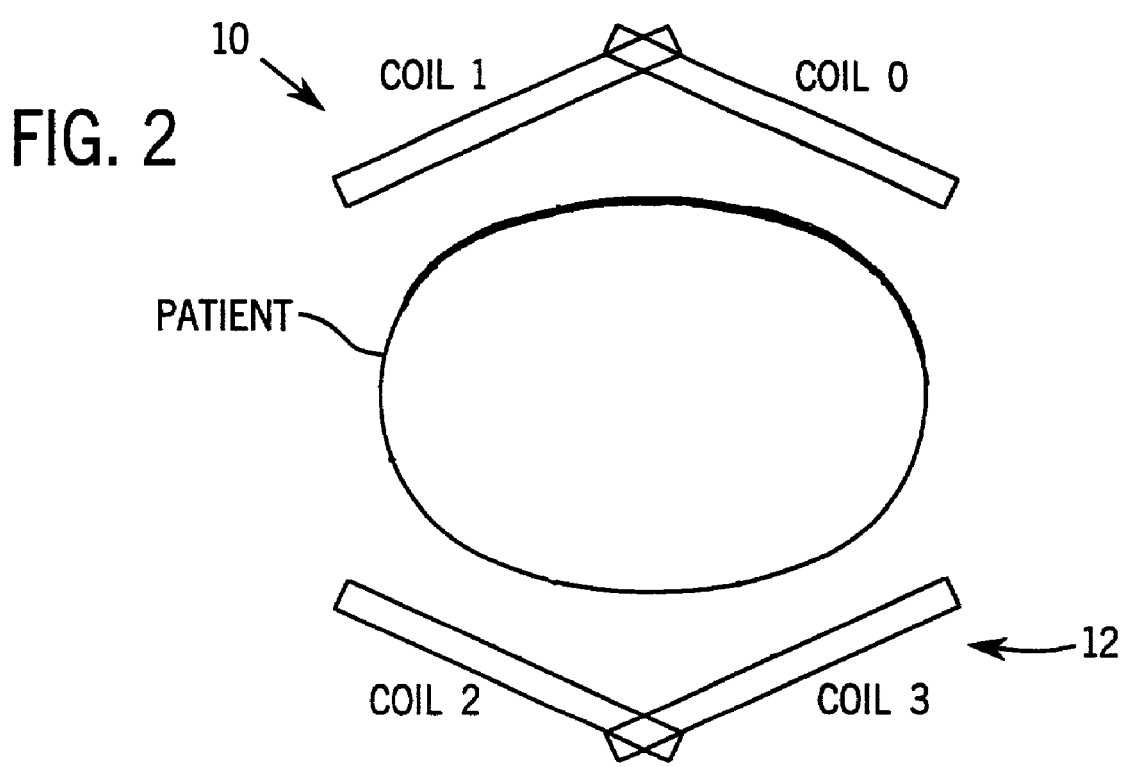
FIG. 2 is a schematic representation of a patient in the MRI system of FIG. 1 surrounded by an array of four local coils.

The local coil array 154 is similar to that disclosed in U.S. Pat. No. 4,825,162. Referring to FIG. 2, each multi-coil set consists of two flexible paddles 10 and 12, each with two surface coil elements fabricated with etched copper on a flexible plastic substrate, for a total of four coil elements. Each coil element is a rectangular loop, approximately 12×25 cm and adjacent elements are overlapped to minimize mutual inductance. The elements are tuned using capacitors distributed around each element, and interface circuitry is added to permit detuning of the element during RF transmission. The coils are positioned anterior and posterior to the imaging volume as depicted in FIG. 2. It should be apparent to those skilled in the art that the present invention is not limited to any particular local coil array and that many alternative local coils are commercially available and suitable for this purpose.

The NMR signals picked up by the coil array 154 are digitized by the transceiver module 150 and transferred to a memory module 160 in the system control 122. When the image scan is completed the four resulting k-space data sets are processed as will be described in more detail below. This data is conveyed through the serial link 115 to the computer system 107 where it is stored in the disk memory 111. In response to commands received from the operator console 100, this data may be archived on the tape drive 112, or it may be further processed by the image processor 106 and conveyed to the operator console 100 and presented on the display 104.

The above-described MRI system may be used to perform many prescribed scans on a patient positioned in the bore of the magnet 141. Such prescriptions identify the type of imaging pulse sequence to be used (e.g., GRE, FSE, EPI, etc.) and the particular scan parameters for the selected pulse sequence (e.g. TR, TE, flip-angle). The present invention may be used with any such prescribed scan to enable it to be performed faster. Typically, the faster scan is achieved by reducing the field of view in one or more phase encoding directions such that fewer phase encoding views are required to sample all of k-space.

Figure 3:
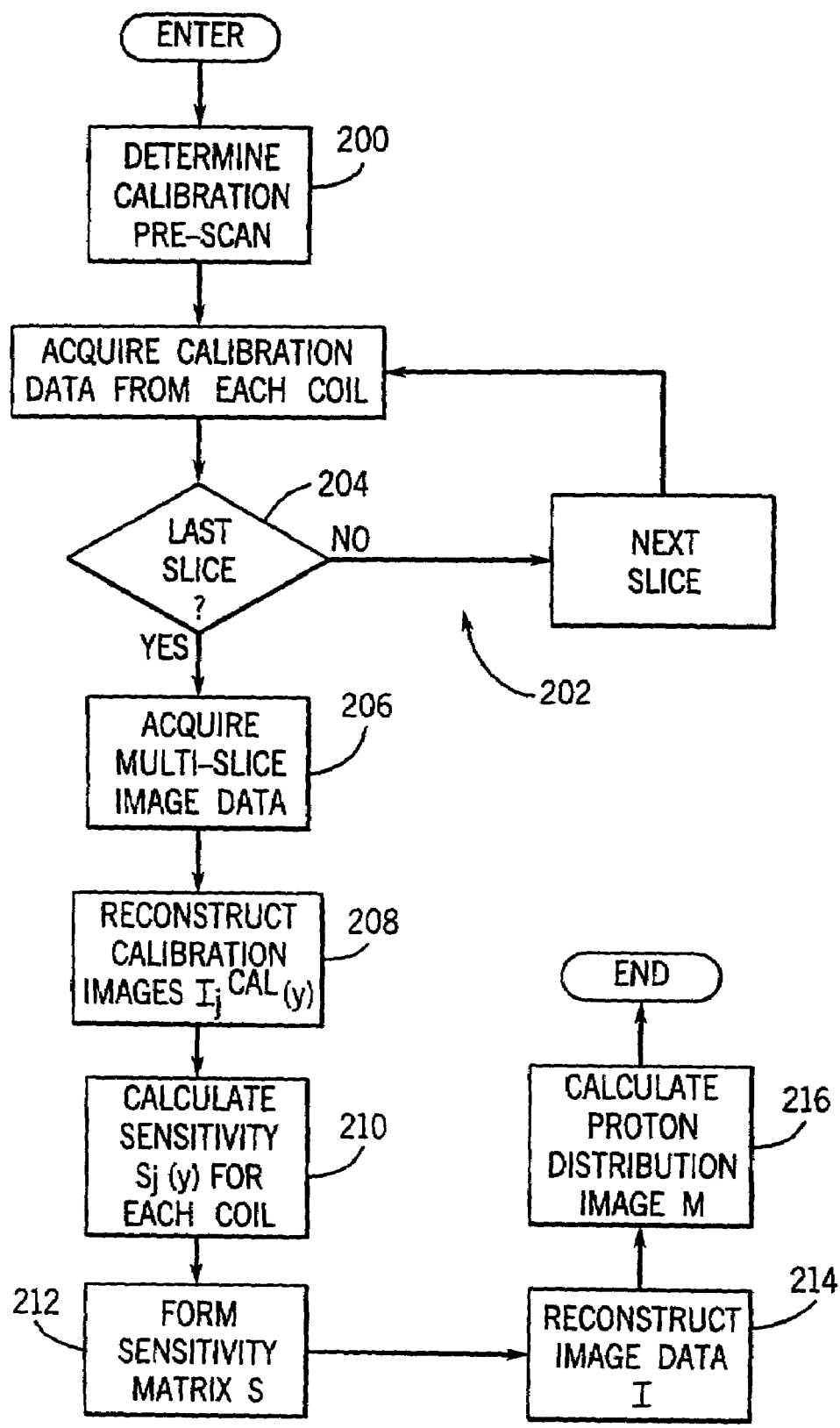
FIG. 3 is a flow chart illustrating the steps performed by the MRI system of FIG. 1 to practice the preferred embodiment of the invention.
Figure 4:
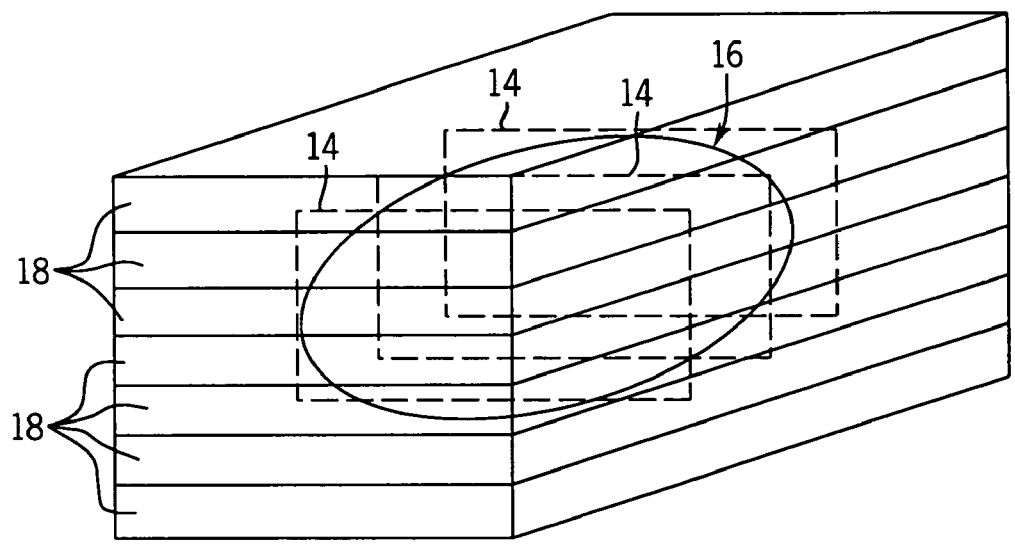
FIG. 4 is a pictorial representation of an object scanned with the MRI system of FIG. 1, illustrating an object calibration acquisition and a number of slice image acquisitions using the SENSE technique.

Referring particularly to FIG. 3, the scan parameters which define the imaging volume are input by the operator along with other scan parameters. These are employed to determine the parameters of a calibration pre-scan as indicated at process block 200. Three such prescribed imaging volume slices are shown in FIG. 4 by axial slices 14. The FOV of these prescribed images may be smaller than the object being imaged, as represented in FIG. 4 by the ellipsoid 16, thus giving rise to aliasing artifacts. In the preferred embodiment the calibration pre-scan employs the surface coil elements 10 and 12 to acquire data from which their sensitivity is determined as disclosed in the above-cited co-pending U.S. patent application Ser. No. 09/851,775. Although many different imaging pulse sequences may be used to perform the calibration pre-scan, in the preferred embodiment a fast, 2D gradient-recalled echo pulse sequence is employed because of its speed and other well known qualities. A flip-angle of 45°, a TR of 100 msec and a TE of 6 msec is prescribed for the calibration pre-scan. The entire imaging volume is covered using contiguous slices from 5 to 10 mm in thickness and with 128×128 voxels in each slice. These parameters are lower in resolution than the typical imaging prescription, but the resolution is sufficient to produce a quality sensitivity matrix S while limiting the calibration pre-scan time.

The calibration pre-scan also includes the acquisition of slice images over a large FOV which is bigger than the object 16. These additional, object boundary calibration slices are shown in FIG. 4 by coronal slices 18 which encompass the entire boundary of the object 16. These additional calibration slices are acquired using the above pulse sequence, but using the body coil 152 instead of the local coils 10 and 12 for receiving the NMR signals. As will be described in more detail below, an image is reconstructed from the object boundary calibration data which enables the boundary of the object 16 to be located.

A loop is entered in which each slice 14 and 18 in the prescribed calibration pre-scan is acquired as indicated at 202. This is done with the patient positioned in the MRI system. When the last calibration slice has been acquired, as indicated at decision block 204, the prescribed image scan is performed as indicated at process block 206. As indicated above, any imaging pulse sequence may be used, but RF excitation is performed using the RF body coil 152 and NMR signal acquisition is performed using the local coil array 154.

The SENSE technique enables the field of view, or number of phase encodings to be reduced along a selected phase encoding axis. This selected phase encoding axis may be along any axis. In the following discussion this phase encoding gradient axis is indicated as the y-axis, however, it should be understood, that any phase encoding axis is possible and the invention is not limited to a specific gradient axis direction.

Referring still to FIG. 3, the 2D image data acquisition during the calibration pre-scan is used to reconstruct a set of calibration images $I_j^{cal}(y)$ as indicated at process block 208. This reconstruction is a two-dimensional, complex Fourier transformation which yields a 128×128 array of complex pixel intensity values for each slice 14 acquired by each local coil. The sensitivity $S_j(y)$ for each local coil j is then calculated at process block 210. in one preferred embodiment the local coil sensitivity $S_j(y)$ is calculated as follows:

$$S_j(y) = \frac{I_j^{cal}(y)}{\sqrt{\sum_{j=0}^{N-1} |I_j^{cal}(y)|^2}}. \quad (9)$$

where N is the number of local coils and $I_j^{cal}(y)$ is a complex image acquired over the full field of view of the imaging volume with surface coil j. One disadvantage of the sensitivity definition in equation (9) is that the complex magnetization of the object M(y) still contains the phase of the object magnetization. The phase information in the reconstructed image will therefore not be correctly represented.

In a second preferred embodiment, the sensitivity $S_j(y)$ is defined as:

$$S_j(y) = \frac{I_j^{cal}(y)}{\sum_{J=0}^{N-1} I_j^{cal}(y)}. \quad (10)$$

The sensitivity definition in equation 10 has the advantage that the complex magnetization completely drops out of the definition, thereby resulting in more accurate phase information in the reconstructed image. A possible disadvantage of this embodiment is less uniform image intensity weighting because of possible partial cancellation of the N complex terms in the denominator of equation (10). Such cancellation is not possible with the sensitivity definition in equation (9) because the N factors in the denominator are positive definite.

Both of these methods for calculating the local coil sensitivity $S_j(y)$ in essence calculate the ratio of the calibration image intensity of the local coil itself and the sum of all the local coil calibration image intensities.

Figure 6:
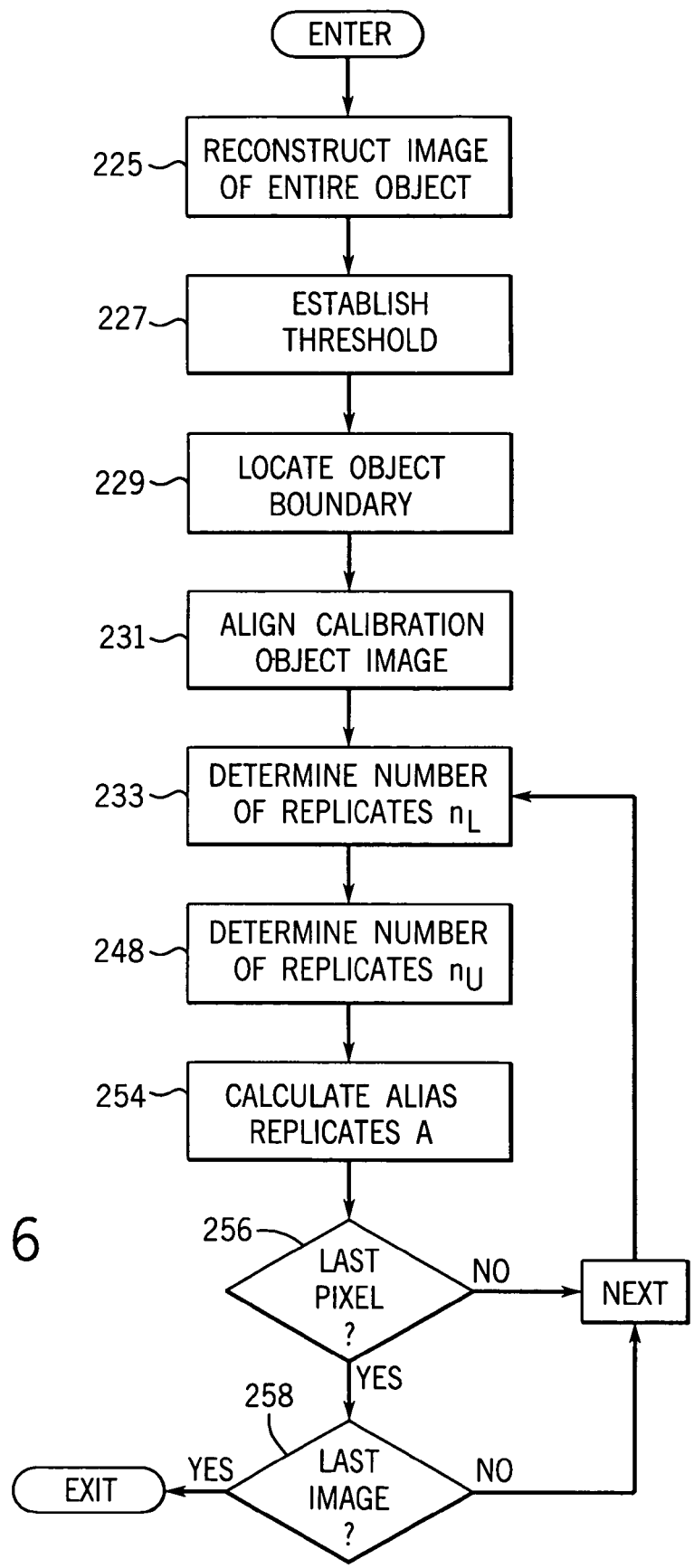
FIG. 6 is a flow chart illustrating the steps used to calculate aliased replicates (A) for each pixel in the image of FIG. 5.

The next step indicated at process block 212 is to form the sensitivity matrix S. As set forth above in equation (6), the sensitivity matrix S is formed by combining the separate coil sensitivities $S_j(y)$ into a single matrix. The alias replication factor A in the sensitivity matrix S is normally set to an assumed value such as A=R, the factor by which the full FOV is reduced in size. As will now be described with reference to the flow chart in FIG. 6, the value of the alias replication factor A at each image pixel can be calculated and plugged into the sensitivity matrix S to improve the SENSE technique. As indicated in FIG. 6 at process block 225, the first step is to reconstruct an image of the object using the object boundary calibration data acquired during the pre-scan. This is a conventional two dimensional Fourier transformation of each coronal slice 18, followed by a magnitude calculation at each image pixel. A signal intensity threshold value is then established at process block 227 by locating the pixel in the object image having the maximum signal intensity and calculating a threshold fraction ($\epsilon$) of this maximum intensity. The resulting threshold value is indicative of pixels within the object boundary. The threshold fraction ($\epsilon$) is manually set and typically ranges from 0.01 to 0.1. The object boundary is then located, as indicated at process block 229, by searching inward from the edges of the object image along the phase encoding direction until a pixel having an intensity above the established threshold is located. All pixels encountered before this location are set to zero, and if the center of the image is reached, the search is stopped along that path. As a result, a calibration object image is produced in which all pixels outside the object 16 are set to zero.

The resulting calibration object image is not necessarily aligned with the prescribed images because it may be acquired with different slice orientations and different image resolution. The next step, therefore, it to align the calibration object image with the prescribed slice images as indicated at process block 231. This is done by linear interpolation between calibration object image pixels to create pixels which are aligned along the phase encoding axis (y) with pixels in the prescribed slice images.

Figure 5:
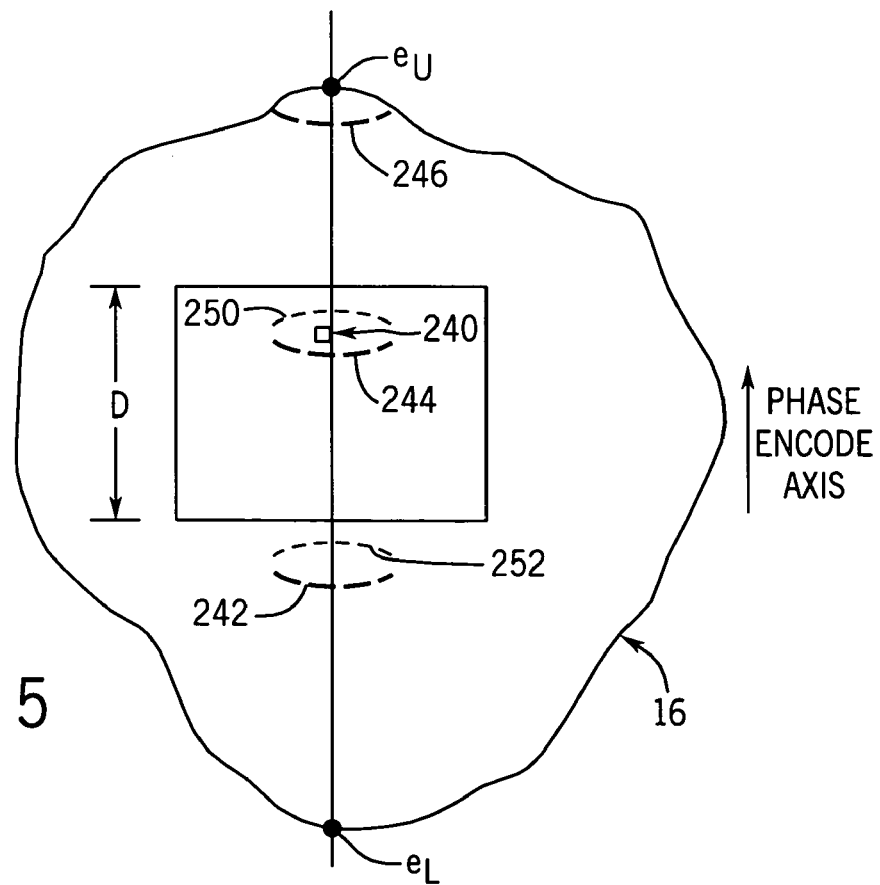
FIG. 5 is a pictorial representation of an image illustrating the method for calculating aliased replicates according to the teachings of the present invention.

A loop is then entered in which the alias replicate A is determined for each pixel location in each of the prescribed images. As indicated at process block 233, the first step is to calculate the number of alias replicates $n_L$ produced at an image pixel by the lower object boundary. Referring to FIG. 5 for any given pixel 240 the lower object boundary point $e_L$ which is aligned with the pixel 240 along the phase encoding axis is located. This is done by searching upward from the bottom of the aligned calibration object image until a non-zero pixel is found. Then, starting with the counter set to one, this lower boundary point $e_L$ is moved in increments of D pixels upward along the phase encoding axis and the number of increments are counted until $e_L$ passes over the pixel 240. In the example, the location $e_L$ is moved upward by two increments as shown by dashed lines 242 and 244 before it passes over pixel 240 as indicated by dashed line 246. The number of counted lower replicates $n_L$ is, therefore, three.

As indicated by process block 240 in FIG. 6 the process is repeated using the upper boundary point $e_U$. That is, the number of increments of D pixels that the upper boundary point $e_U$ can be moved downward along the phase encoding axis before it passes over the pixel location 240 are counted. In the example of FIG. 5, only one increment occurs as indicated by dotted line 250 before the pixel location 240 is passed over as indicated by dotted line 252. As a result, the number of lower boundary replicates $n_U$ is two.

Referring again to FIG. 6, after the upper and lower boundary replicates $n_L$ and $n_U$ have been determined for a pixel, the total aliasing replicates (A) at the pixel are calculated at process block 254. This calculation is as follows:

$$A = n_L + n_U - 1. \quad (11)$$

As indicated at decision block 256, this process is repeated for each pixel location in the prescribed slice. And as indicated at decision block 258, the process is repeated for each prescribed slice location. The resulting array of alias replicate values A indicate the number of alias replicates at each pixel location in each of the prescribed, reduced FOV slice images. These values are used in the coil sensitivity matrix S for each pixel location.

As indicated at process block 214 in FIG. 3, the next step in the method is to reconstruct each 2D image produced by each local coil. This is accomplished by performing a 2D Fourier transformation on the acquired image data and organizing the complex intensity values into an array I as expressed in equation (4). The proton distribution image M is then calculated at process block 216 using the above equation (7):

$$M = [(S^*S)^{-1}S^*]I$$

where S* is the complex conjugate of the sensitivity matrix S. Typically a magnitude image is calculated from the I and Q values at each pixel location in the resulting image M.

The invention claimed is:

1. A method for producing a prescribed image of an object having a field of view D with a magnetic resonance imaging (MRI) system, the steps comprising:

A) performing a pulse sequence with the MRI system to acquire calibration data with each of N local coils positioned near the object;

B) performing a prescribed imaging pulse sequence with the MRI system to acquire image data with each of the N local coils;

C) reconstructing calibration images with the calibration data;

D) acquiring a calibration object image with the MRI system which depicts the object boundary disposed outside the field of view of the prescribed image;

E) calculate a coil sensitivity image for each local coil using the calibration images;

F) calculating an aliasing replicate number A for each pixel location in the prescribed image using the field of view D and the location of the object boundary;

G) forming a sensitivity matrix S from the coil sensitivity images and the calculated aliasing replicate numbers A;

H) reconstructing images I from the image data acquired in step b); and

I) producing the prescribed image by calculating a proton distribution image M using the sensitivity matrix S and the images I.

2. The method as recited in claim 1 in which step I) is performed using the formula:

$$M=[(S^*S)-1S^*]I,$$

where $S^*$ is the complex conjugate of the sensitivity matrix S.

3. The method as recited in claim 1 in which the pulse sequence used in step A) is different than the prescribed imaging pulse sequence used in step B).

4. The method as recited in claim 3 in which the calibration data acquired in step A) and the image data acquired in step B) are acquired from substantially the same imaging volume in the object and the calibration object image is acquired from a substantially larger imaging volume.

5. The method as recited in claim 1 in which step F) includes:

counting the number of times the aligned boundary location can be moved an increment D along the phase encoding axis before it passes the pixel location.

6. The method as recited in claim 1 in which step D) includes:

i) producing a calibration object image which depicts the entire object disposed within a plane containing the slice defined by the prescribed image;

ii) locating the object boundary in the calibration object image; and iii) aligning pixels in the calibration object image with pixels in the prescribed image.

* * * * *